(12) United States Patent
Shin (10) Patent No.: US 7,198,971 B2
(45) Date of Patent: Apr. 3, 2007

(54) NITRIDE SEMICONDUCTOR THIN FILM HAVING FEWER DEFECTS AND METHOD OF GROWING THE SAME

(75) Inventor: Johngeon Shin, Seongman-si (KR)

(73) Assignee: LG Electronics Inc., Seoul (KR)

( * ) Notice: Subject to any disclaimer, the term of this patent is extended or adjusted under 35 U.S.C. 154(b) by 72 days.

(21) Appl. No.: 11/023,540

(22) Filed: Dec. 29, 2004

(65) Prior Publication Data

US 2005/0139857 A1  Jun. 30, 2005

(30) Foreign Application Priority Data

Dec. 31, 2003  (KR) ............. 10-2003-0101283

(51) Int. Cl.
  *H01L 21/00* (2006.01)
  *H01L 21/36* (2006.01)
(52) U.S. Cl. ............ 438/44; 438/481; 257/615; 257/E33.025; 117/952
(58) Field of Classification Search ............ 438/481, 438/42, 43, 44
See application file for complete search history.

(56) References Cited

U.S. PATENT DOCUMENTS

2001/0008791 A1 *  7/2001  Gehrke et al. ............ 438/481

* cited by examiner

*Primary Examiner*—Andy Huynh
*Assistant Examiner*—Earl Taylor
(74) *Attorney, Agent, or Firm*—Birch, Stewart, Kolasch & Birch, LLP

(57) ABSTRACT

The present invention relates to a nitride semiconductor thin film having less defects and a method of growing the same. According to the present invention, the nitride semiconductor thin film with lower defect density can be manufactured by forming grooves on a substrate, sequentially forming a buffer layer and a first nitride semiconductor thin film on a whole surface of the substrate, etching higher defect density regions of the first nitride semiconductor thin film, and then laterally growing a second nitride semiconductor thin film. Thus, a highly crystalline nitride semiconductor thin film can be obtained. Therefore, there are advantages in that high-efficiency, high-power and high-reliability optical devices or electronic devices can be manufactured and high throughput can also be obtained by using the obtained nitride semiconductor thin film.

14 Claims, 6 Drawing Sheets

NITRIDE SEMICONDUCTOR THIN FILM HAVING FEWER DEFECTS AND METHOD OF GROWING THE SAME

BACKGROUND OF THE INVENTION

1. Field of the Invention

The present invention relates to a nitride semiconductor thin film having fewer defects and a method of growing the same. More particularly, the present invention relates to a nitride semiconductor thin film having fewer defects and a method of growing the same wherein a nitride semiconductor thin film having lower defect density can be obtained by forming grooves on a substrate, sequentially forming a buffer layer and a first nitride semiconductor thin film on an entire top surface of the substrate, etching higher defect density regions of the first nitride semiconductor thin film, and then laterally growing a second nitride semiconductor thin film.

2. Description of the Related Art

In general, nitride semiconductor thin films are widely used in optical devices capable of emitting light in a short wavelength region using a wide band gap, and research on the applications of high-temperature, high-frequency and high-power electronic devices have been actively performed.

These nitride semiconductor thin films are grown on a sapphire substrate that is generally stable at high temperatures.

However, since there are significant differences in the coefficient of thermal expansion and lattice constant between the nitride semiconductor thin film and the sapphire substrate, there is a problem in that defects such as breakthrough potential frequently occur.

To reduce defects in the sapphire substrate and the nitride semiconductor thin film, a process of forming a layer of $Al_xGa_yIn_{1-x-y}N$ ($0 \leq x \leq 1$, $0 \leq y \leq 1$, $0 \leq x+y \leq 1$) SiN or a laminate film with the previous layers laminated thereon, as a buffer layer, on a sapphire substrate and then growing a nitride semiconductor thin film on the buffer layer has recently been used.

If the nitride semiconductor thin film has been grown onto the buffer layer as described above, the grown nitride semiconductor thin film has break-through potential density of $10^8$ to $10^9$ $cm^{-2}$, and thus its defect density can be reduced.

Furthermore, to manufacture a blue-violet laser diode or a high-power, high-efficiency, high-reliability light emitting diode, it is essential to reduce defect density.

To reduce break-through potential, 1) a method of forming a pattern on a sapphire substrate to adjust longitudinal and transverse growth, 2) the Lateral Epitaxial Overgrowth (LEO) method of growing a nitride semiconductor thin film onto a sapphire substrate, forming a specific shaped dielectric film on the nitride semiconductor thin film, and again growing a nitride semiconductor thin film, 3) the Pendeo epitaxial growth method of growing a nitride semiconductor thin film onto a sapphire substrate, etching the nitride semiconductor thin film into a specific shape, and again growing the nitride semiconductor thin film, and the like are generally employed.

Figure 1A:
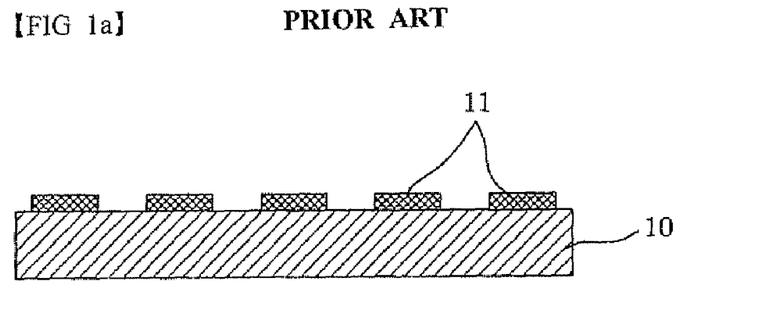
FIGS. 1a to 1e are views illustrating a process of growing a nitride semiconductor thin film using a sapphire substrate with a mask pattern formed thereon according to the prior art.

FIGS. 1a to 1e show a process of growing a nitride semiconductor thin film using a sapphire substrate with a mask pattern formed thereon according to the prior art. Referring to the figures, a dielectric mask pattern 11 is first formed on the sapphire substrate 10 such that the sapphire substrate 10 can be exposed at a regular interval (FIG. 1a).

Figure 1B:
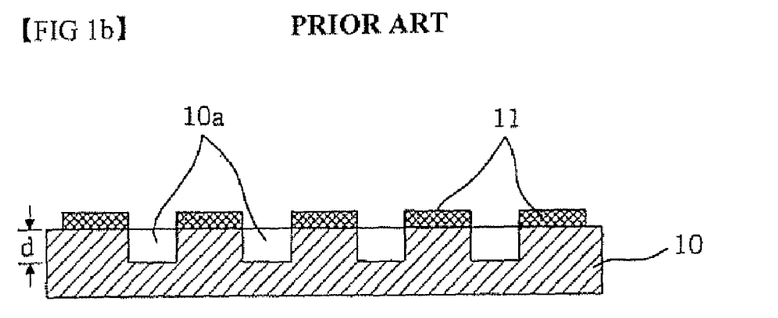

Then, regions of the sapphire substrate 10 that are exposed through the dielectric mask pattern 11 are etched at a predetermined depth d (FIG. 1b).

Figure 1C:
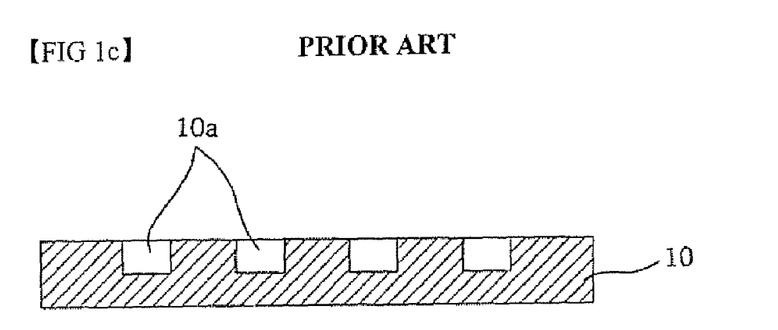

Subsequently, as shown in FIG. 1c, if the dielectric mask pattern 11 is removed, a sapphire substrate with grooves 10a formed thereon at a regular interval is finished.

Figure 1D:
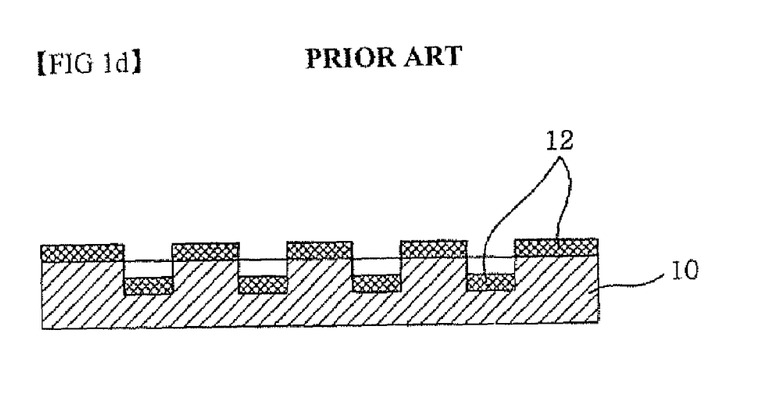

Next, a buffer layer 12 is grown on an entire top surface of the sapphire substrate 10 (FIG. 1d).

Figure 1E:
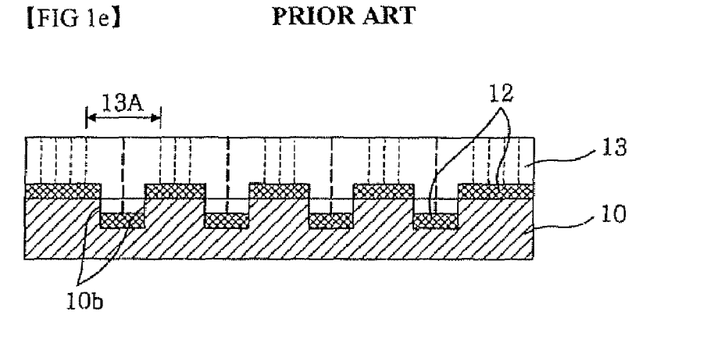

Finally, a nitride semiconductor thin film 13 is grown on the top surface of the buffer layer 12 (FIG. 1e).

At this time, the break-through potential of the nitride semiconductor thin film 13A growing on side surfaces of the sapphire substrate 10 dissipates, and thus, defect density is reduced at regions of the sapphire substrate where the pattern was formed.

A method of growing a nitride semiconductor thin film using a sapphire substrate with the aforementioned mask pattern formed thereon has been recently applied to the manufacture of high-power and high-efficiency light emitting diodes.

Figure 2A:
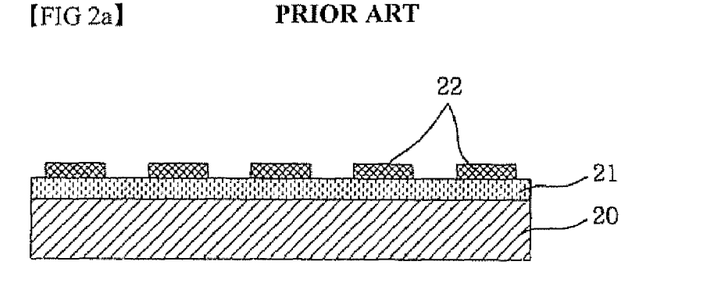
FIGS. 2a to 2c are views illustrating a process of growing a nitride semiconductor thin film by means of Lateral Epitaxial Overgrowth (LEO) according to the prior art.
Figure 2B:
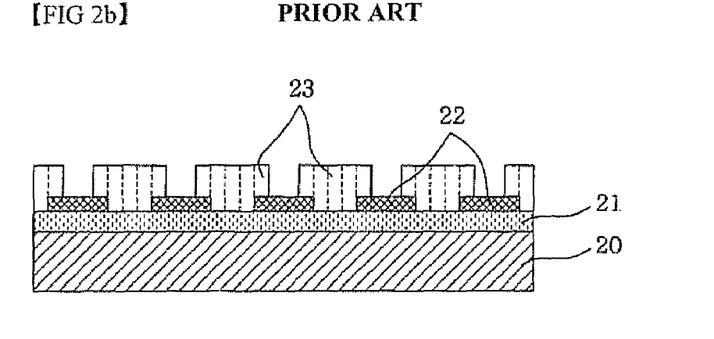
Figure 2C:
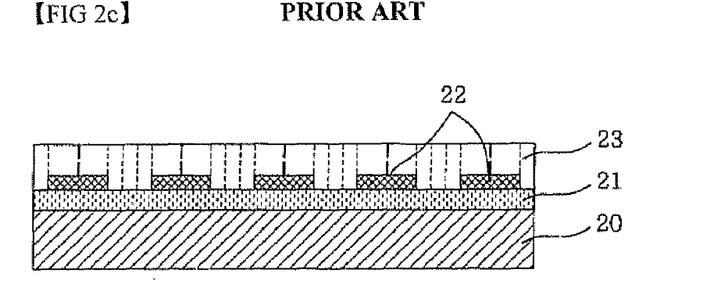

FIGS. 2a to 2c show a process of growing a nitride semiconductor thin film by means of Lateral Epitaxial Overgrowth (LEO) according to the prior art. Referring to the figures, a first nitride semiconductor thin film 21 is formed on a sapphire substrate 20, and a dielectric mask pattern 22 is formed on the sapphire substrate 21 such that the sapphire substrate 21 can be exposed at a regular interval (FIG. 2a).

Then, a second nitride semiconductor thin film 23 is grown on regions of the first nitride semiconductor thin film 21 that are selectively exposed through the dielectric mask pattern 22 (FIG. 2b).

Here, the second nitride semiconductor thin films 23 that has been grown on the exposed regions of the first nitride semiconductor thin film 21 meet each other on the dielectric mask patterns 22 and grows further. As shown in FIG. 2c, defects in the second nitride semiconductor thin film 23 grown on the dielectric mask pattern 22 are reduced.

Figure 3A:
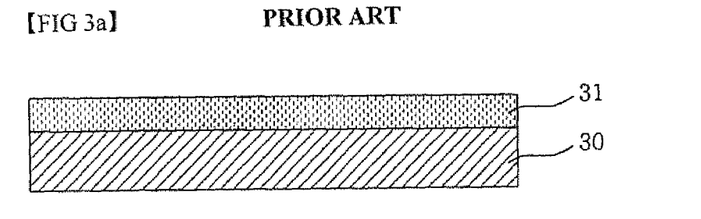
FIGS. 3a to 3c are views illustrating a process of growing a nitride semiconductor thin film by means of Pendeo Epitaxial Growth according to the prior art.
Figure 3B:
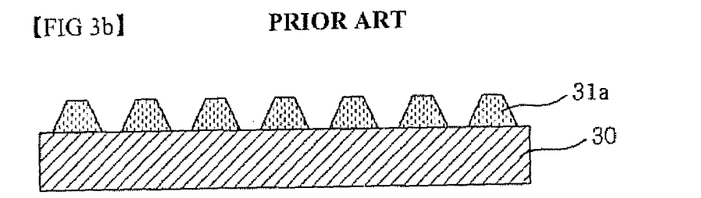
Figure 3C:
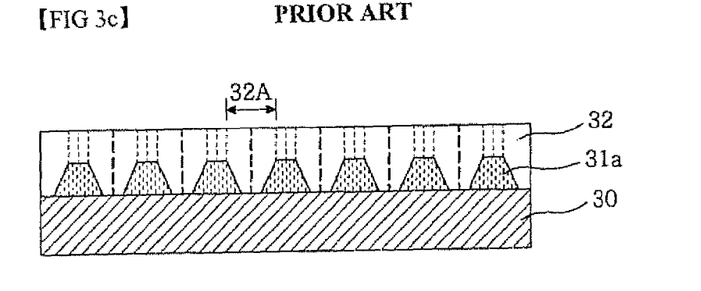

FIGS. 3a to 3c show a process of growing a nitride semiconductor thin film by means of Pendeo Epitaxial Growth according to the prior art. Referring to the figures, a first nitride semiconductor thin film 31 is formed on a sapphire substrate 30 (FIG. 3a). The grown first nitride semiconductor thin film 31 is etched to become a periodic stripe pattern 31a (FIG. 3b), and a second nitride semiconductor thin film 32 is laterally grown on the sapphire substrate 30 using the periodic stripe pattern 31a (FIG. 3c).

Thus, the break-through potential density of the laterally grown second nitride semiconductor thin film 32A is reduced.

As described above, according to the conventional methods of reducing defects in the nitride semiconductor, defects in the nitride semiconductor thin film that is positioned on regions where a pattern is formed or grown laterally from regions where a dielectric pattern is formed are reduced, whereas the defects remain in regions where a pattern or dielectric pattern is not formed. Therefore, there is a problem in that improvement in overall crystalline characteristics cannot be obtained.

That is, defect density is reduced as a whole, but regions where defect density is locally higher or lower exist periodically.

SUMMARY OF THE INVENTION

The present invention is conceived to solve the aforementioned problem. Accordingly, an object of the present invention is to provide a nitride semiconductor thin film having fewer defects and a method of growing the same wherein a nitride semiconductor thin film having lower defect density can be obtained by sequentially forming a buffer layer and a first nitride semiconductor thin film on a substrate with grooves formed thereon, etching higher defect density regions of the first nitride semiconductor thin film, forming lower defect density regions into a periodic stripe pattern, and then laterally growing a second nitride semiconductor thin film using the pattern.

Another object of the present invention is to provide a nitride semiconductor thin film having fewer defects and a method of growing the same wherein a second nitride semiconductor thin film with lower defect density can be obtained as a whole by forming the second nitride semiconductor thin film using a first nitride semiconductor thin film with lower defect density such that the second nitride semiconductor thin film can be grown in a state where fewer defects are maintained, and by growing regions, on which a dielectric mask pattern is positioned, into the nitride semiconductor thin film by means of the Lateral Epitaxial Overgrowth (LEO).

According to a first aspect of the present invention for achieving the above objects, there is provided a method of growing a nitride semiconductor thin film having fewer defects, comprising a first step of forming a buffer layer on an entire top surface of a substrate with stripe-shaped grooves periodically formed thereon; a second step of growing a first nitride semiconductor thin film on the buffer layer; a third step of forming a dielectric mask pattern on the first nitride semiconductor thin film such that the first nitride semiconductor thin film grown on regions of the substrate where the stripe-shaped grooves are formed are masked and the first nitride semiconductor thin film grown on regions of the substrate where the stripe-shaped grooves are not formed are exposed; a fourth step of etching regions of the first nitride semiconductor thin film, which are exposed through the dielectric mask pattern, into a protruding periodic stripe pattern of the first nitride semiconductor thin film, and removing the dielectric mask pattern from the first nitride semiconductor thin film; and a fifth step of laterally growing a second nitride semiconductor thin film using the nitride semiconductor thin film pattern.

According to a second aspect of the present invention for achieving the above objects, there is provided a method of growing a nitride semiconductor thin film having fewer defects, comprising a first step of forming a buffer layer on an entire top surface of a substrate with stripe-shaped grooves periodically formed thereon; a second step of growing a first nitride semiconductor thin film on the buffer layer; a third step of forming a dielectric mask pattern on the first nitride semiconductor thin film such that the first nitride semiconductor thin film grown on regions of the substrate where the stripe-shaped grooves are formed are exposed and the first nitride semiconductor thin film grown on regions of the substrate where the stripe-shaped grooves are not formed are masked; and a fourth step of laterally growing a second nitride semiconductor thin film on regions of the first nitride semiconductor thin film, which are exposed through the dielectric mask pattern, using the dielectric mask pattern.

According to a third aspect of the present invention for achieving the above objects, there is provided a method of growing a nitride semiconductor thin film having fewer defects, comprising a first step of forming a buffer layer on an entire top surface of a substrate with grooves formed thereon; a second step of growing a first nitride semiconductor thin film on the buffer layer; a third step of forming a dielectric mask pattern on the first nitride semiconductor thin film such that the first nitride semiconductor thin film grown on regions of the substrate where the grooves are formed are masked and the first nitride semiconductor thin film grown on regions of the substrate where the grooves are not formed are exposed; a fourth step of etching regions of the first nitride semiconductor thin film, which are exposed through the dielectric mask pattern, into a first nitride semiconductor thin film pattern, and removing the dielectric mask pattern from the first nitride semiconductor thin film; and a fifth step of laterally growing a second nitride semiconductor thin film using the nitride semiconductor thin film pattern.

According to a fourth aspect of the present invention for achieving the above objects, there is provided a method of growing a nitride semiconductor thin film having fewer defects, comprising a first step of forming a buffer layer on an entire top surface of a substrate with grooves formed thereon; a second step of growing a first nitride semiconductor thin film on the buffer layer; a third step of forming a dielectric mask pattern on the first nitride semiconductor thin film such that the first nitride semiconductor thin film grown on regions of the substrate where the grooves are formed are exposed and the first nitride semiconductor thin film grown on regions of the substrate where the grooves are not formed are masked; and a fourth step of laterally growing a second nitride semiconductor thin film on regions of the first nitride semiconductor thin film, which are exposed through the dielectric mask pattern, using the dielectric mask pattern.

According to a fifth aspect of the present invention for achieving the above objects, there is provided a method of growing a nitride semiconductor thin film having fewer defects, comprising the steps of forming grooves on a substrate; sequentially forming a buffer layer and a first nitride semiconductor thin film on an entire top surface of the substrate; etching regions of the first nitride semiconductor thin film except regions of the first nitride semiconductor thin film formed on the grooves; and forming a second nitride semiconductor thin film.

According to a sixth aspect of the present invention for achieving the above objects, there is provided a nitride semiconductor thin film having fewer defects, comprising a substrate with grooves formed thereon; a buffer layer formed on an entire top surface of the substrate; a first nitride semiconductor thin film formed on the buffer layer and patterned such that regions thereof formed on the grooves protrude upward; and a second nitride semiconductor thin film laterally grown on the first nitride semiconductor thin film using a pattern of the first nitride semiconductor thin film.

According to a seventh aspect of the present invention for achieving the above objects, there is provided a nitride semiconductor thin film having fewer defects, comprising a substrate with grooves formed thereon; a buffer layer formed on an entire top surface of the substrate; a first nitride semiconductor thin film formed on the buffer layer; a dielectric mask pattern formed on the first nitride semiconductor thin film; and a second nitride semiconductor thin film laterally grown on regions of the first nitride semiconductor thin film which are exposed through the dielectric mask pattern.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Hereinafter, preferred embodiments of the present invention will be described in detail with reference to the accompanying drawings.

Figure 4A:
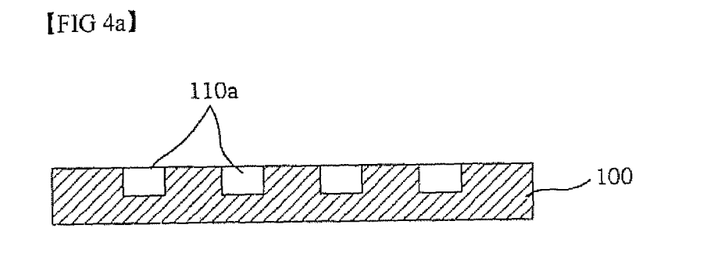
FIGS. 4a to 4f are views view illustrating a process of growing a nitride semiconductor thin film having fewer defects according to a first embodiment of the present invention.
Figure 4B:
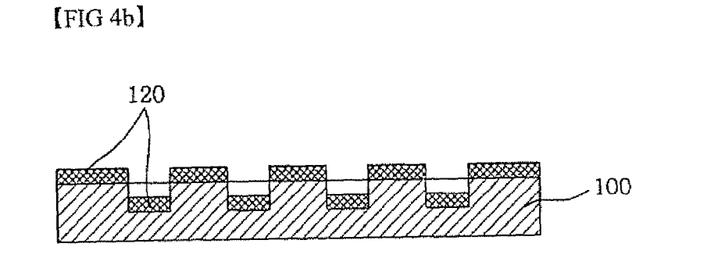

FIGS. 4a to 4f show a process of growing a nitride semiconductor thin film having fewer defects according to a first embodiment of the present invention. As shown in FIG. 4a, a substrate 100 with stripe-shaped grooves 110a formed thereon is first prepared. Then, a buffer layer 120 is formed on an entire top surface of the substrate 100 (FIG. 4b).

Here, as viewed from above, the stripe-shaped grooves 110a are formed on the substrate 100 such grooves spaced apart from one another are arranged in row and column format.

Further, it is preferred that the buffer layer 120 be made of any one of a layer of $Al_xGa_yIn_{1-x-y}N$ ($0 \leq x \leq 1$, $0 \leq y \leq 1$, $0 \leq x+y \leq 1$), a layer of SiN and a laminate film with the previous layers laminated thereon.

In addition, the substrate 100 may be made of any one selected from a group consisting of silicon carbide (SiC), sapphire, gallium arsenide (GaAs) and gallium nitride (GaN).

Figure 4C:
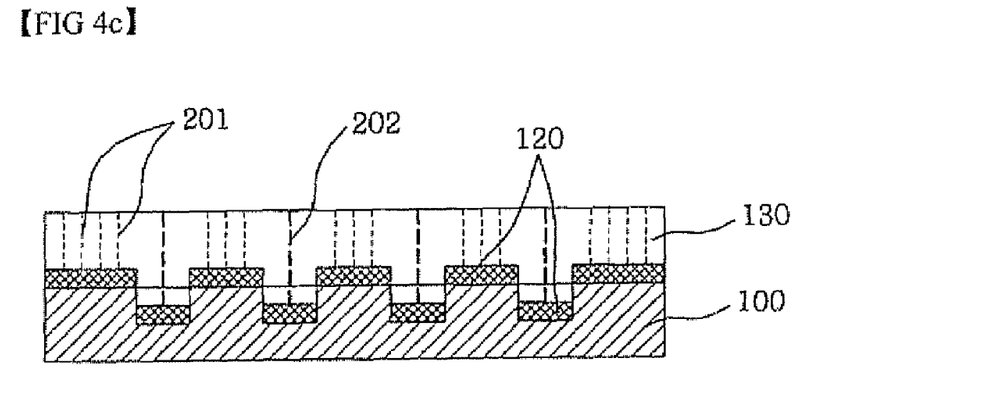

Subsequently, a first nitride semiconductor thin film 130 is formed on the buffer layer 120 (FIG. 4c).

At this time, regions where defect density is higher (there are more defects 201 in regions of the first nitride semiconductor thin film formed on regions where a stripe-shaped groove is not formed) and regions where defect density is lower (there are fewer defects 202 in regions of the first nitride semiconductor thin film formed on the stripe-shaped groove) are alternately formed in the grown first nitride semiconductor thin film 130.

Figure 4D:
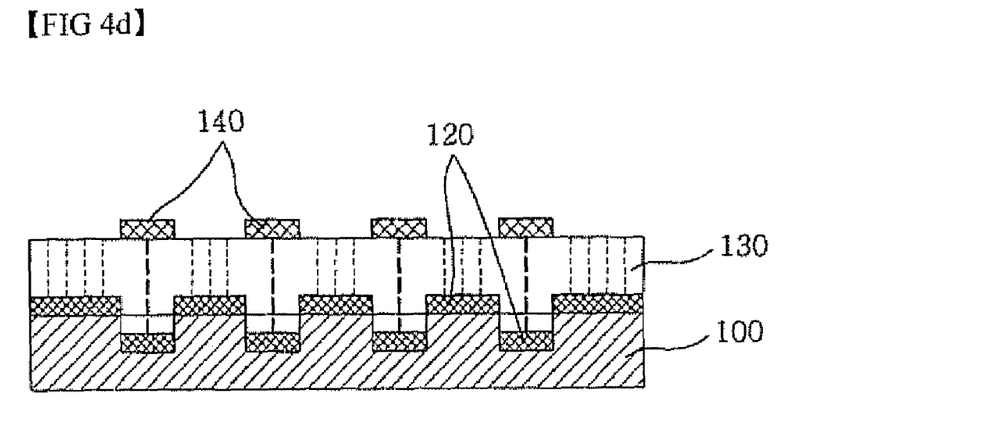

Next, as shown in FIG. 4d, a dielectric mask pattern 140 is formed on the first nitride semiconductor thin film 130 in such a manner that the first nitride semiconductor thin film 130 grown on the stripe-shaped grooves are masked and the first nitride semiconductor thin film 130 grown on the regions where the stripe-shaped grooves are not formed are exposed.

That is, the lower defect density regions of the first nitride semiconductor thin film are masked with the dielectric mask pattern 140, whereas the higher defect density regions of the first nitride semiconductor thin film are exposed.

Figure 4E:
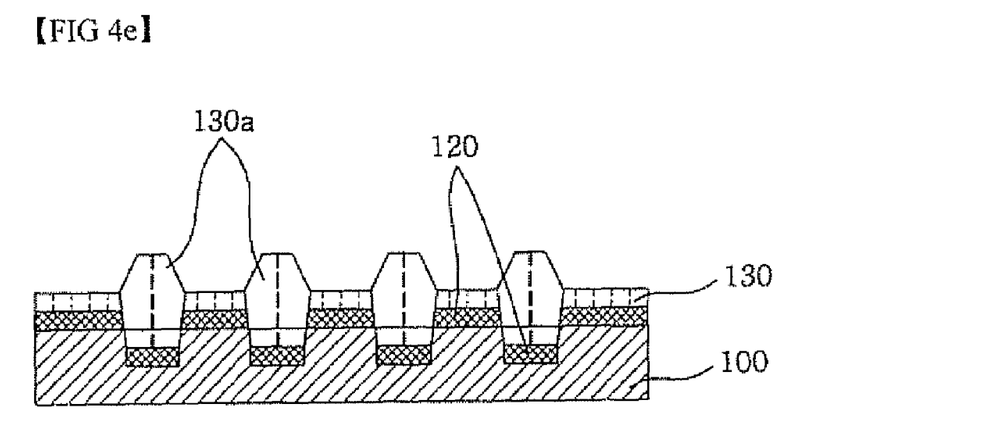

Then, the first nitride semiconductor thin film 130, which is exposed through the dielectric mask pattern 140, is etched into a first nitride semiconductor thin film pattern 130a in a stripe shape, and the dielectric mask pattern 140 is then removed (FIG. 4e).

Here, the higher defect density regions, which are exposed through the dielectric mask pattern 140, of the first nitride semiconductor thin film are etched, whereas the lower defect density regions of the first nitride semiconductor thin film are formed into the protruding nitride semiconductor thin film pattern in a stripe shape.

Figure 4F:
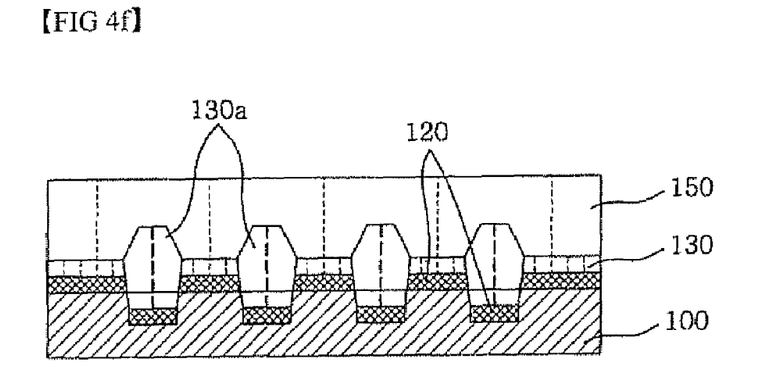

Thereafter, a second nitride semiconductor thin film 150 is laterally grown by using the nitride semiconductor thin film pattern 130a (FIG. 4f).

According to the first embodiment of the present invention, therefore, the nitride semiconductor thin film with lower defect density can be fabricated by forming the buffer layer and the first nitride semiconductor thin film on the substrate with the stripe-shaped grooves formed thereon, etching the higher defect density regions of the first nitride semiconductor thin film, forming the lower defect density regions of the first nitride semiconductor thin film into the periodic stripe pattern, and laterally growing the second nitride semiconductor thin film using the pattern.

Figure 5A:
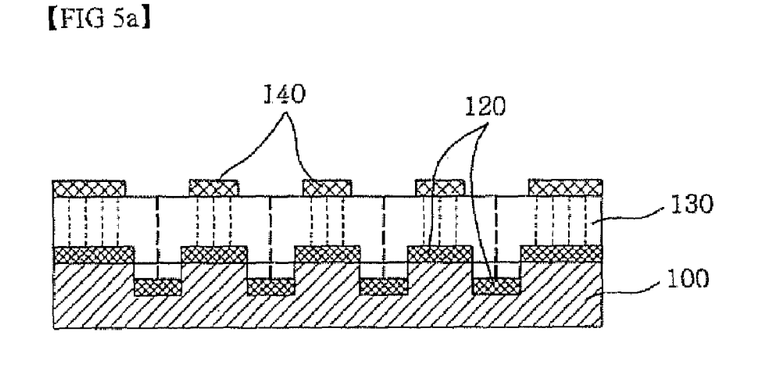
FIGS. 5a to 5c are views illustrating a process of growing a nitride semiconductor thin film having fewer defects according to a second embodiment of the present invention.
Figure 5B:
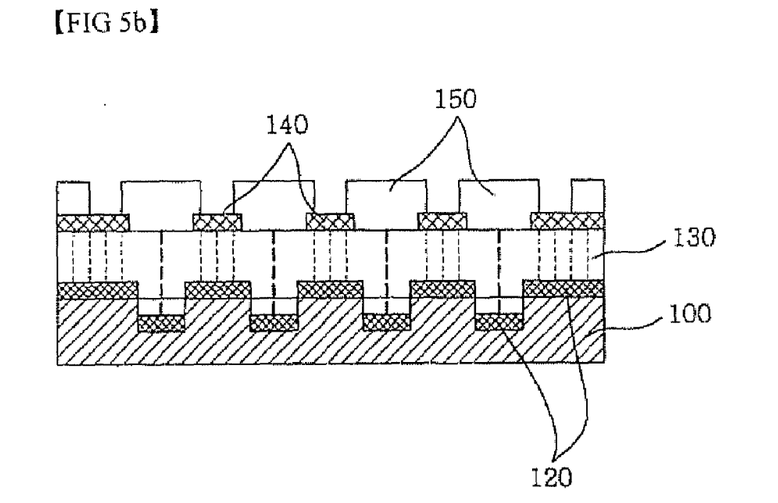
Figure 5C:
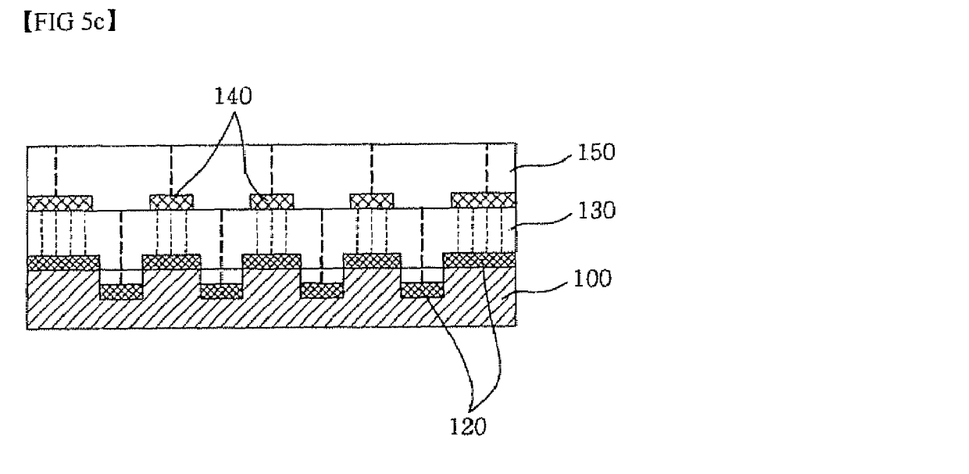

FIGS. 5a to 5c show a process of growing a nitride semiconductor thin film having fewer defects according to a second embodiment of the present invention. The second embodiment of the present invention is continued after the step of FIG. 4c of the first embodiment of the present invention. That is, as shown in FIG. 5a, the dielectric mask pattern 140 is formed on the first nitride semiconductor thin film 130 in such a manner that the first nitride semiconductor thin film 130 grown on the stripe-shaped grooves is exposed and the first nitride semiconductor thin film 130 grown on the regions where the stripe-shaped grooves are not formed is masked.

In conclusion, according to the second embodiment of the present invention, the lower defect density regions of the first nitride semiconductor thin film are exposed, whereas the higher defect density regions of the first nitride semiconductor thin film are masked with the dielectric mask pattern 140.

Therefore, the lower defect density regions of the first nitride semiconductor thin film are exposed in a stripe shape.

Thereafter, the second nitride semiconductor thin film 150 is laterally grown on the first nitride semiconductor thin film that is exposed through the dielectric mask pattern (FIGS. 5b and 5c).

According to the second embodiment of the present invention, therefore, a second nitride semiconductor thin film with lower defect density can be obtained as a whole by forming the second nitride semiconductor thin film using a first nitride semiconductor thin film with lower defect density such that the second nitride semiconductor thin film can be grown in a state where fewer defects are maintained, and by growing regions, on which a dielectric mask pattern is positioned, into the nitride semiconductor thin film by means of Lateral Epitaxial Overgrowth (LEO).

Figure 6A:
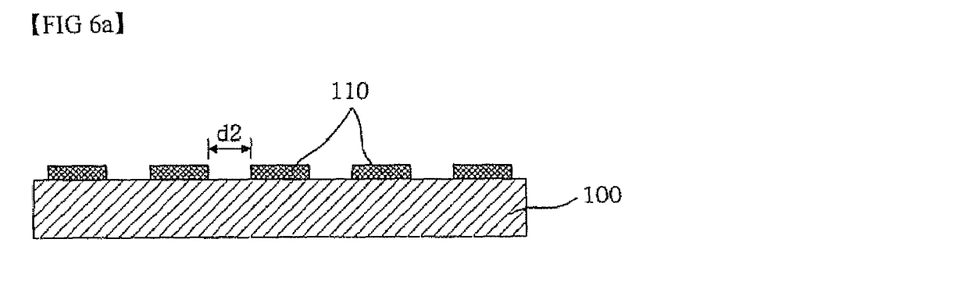
FIGS. 6a to 6c are views illustrating a process of periodically forming stripe-shaped grooves on a substrate according to the present invention.
Figure 6B:
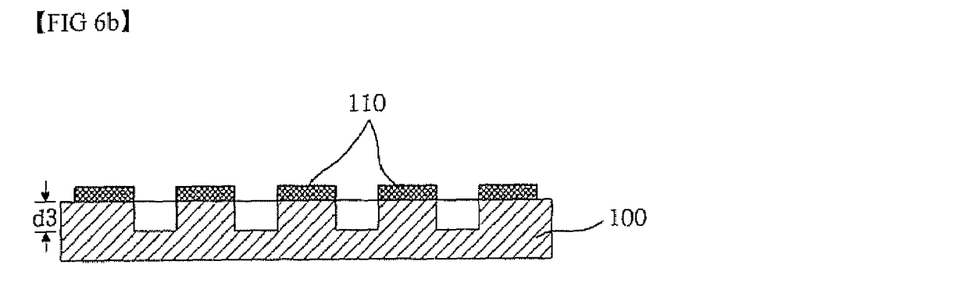
Figure 6C:
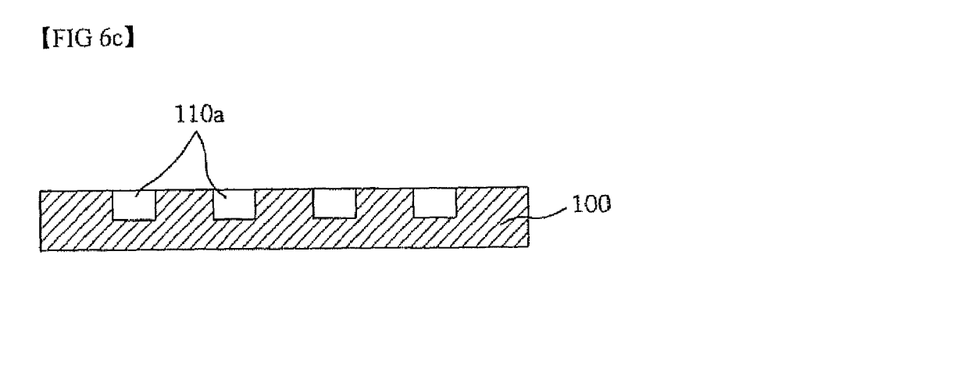

FIGS. 6a to 6c show a process of periodically forming stripe-shaped grooves on a substrate according to the present invention. The dielectric mask pattern 110 is formed on the substrate 100 such that the substrate 100 can be exposed at a regular interval d2 (FIG. 6a).

At this time, the interval d of the substrate 100 that is exposed through the dielectric mask pattern 110 is preferably within a range of 0.1 to 15.0 μm.

Then, regions of the substrate 100 that are exposed through the dielectric mask pattern 110 are etched at a predetermined depth d3 (FIG. 6b).

Here, the depth of the substrate 100 to be etched is preferably within a range of 0.1 to 10 μm.

Further, if the dielectric mask pattern 110 is removed, the substrate 100 with stripe-shaped grooves periodically formed thereon is obtained.

In the first and second embodiments of the present invention, the grooves may be shaped as a polygon or circle.

Further, if the buffer layer is formed to have a thickness smaller than a height of an inner wall of the groove, the first nitride semiconductor thin film can be laterally grown on the buffer layer in the groove. Thus, defects can be further reduced.

According to the present invention described above, a nitride semiconductor thin film with lower defect density can be obtained by forming grooves on a substrate, sequentially forming a buffer layer and a first nitride semiconductor thin film on an entire top surface of the substrate, etching higher defect density regions of the first nitride semiconductor thin film, and then laterally growing a second nitride semiconductor thin film. Therefore, there are advantages in that high-efficiency, high-power and high-reliability optical devices or electron devices can be manufactured and high throughput can also be obtained by using the highly crystalline nitride semiconductor thin film in the manufacture of the devices.

Although the present invention has been illustrated and described in connection with the preferred embodiments, it will be readily understood by those skilled in the art that various modifications and changes can be made thereto without departing from the spirit and scope of the present invention. It is also apparent that the modifications and changes can fall within the scope of the present invention defined by the appended claims.

What is claimed is:

1. A method of growing a nitride semiconductor thin film, comprising:
    a first step of forming a buffer layer on an entire top surface of a substrate with stripe-shaped grooves periodically formed thereon;
    a second step of growing a first nitride semiconductor thin film on the buffer layer;
    a third step of forming a dielectric mask pattern on the first nitride semiconductor thin film such that the first nitride semiconductor thin film grown on regions of the substrate where the stripe-shaped grooves are formed are masked and the first nitride semiconductor thin film grown on regions of the substrate where the stripe-shaped grooves ate not formed are exposed;
    a fourth step of etching regions of the first nitride semiconductor thin film, which are exposed through the dielectric mask pattern, into a protruding periodic stripe pattern of the first nitride semiconductor thin film, and removing the dielectric mask pattern from the first nitride semiconductor thin film; and
    a fifth step of laterally growing a second nitride semiconductor thin film using the nitride semiconductor thin film pattern.

2. The method as claimed in claim 1, wherein the substrate with the stripe-shaped grooves periodically formed thereon is manufactured by:
    forming the dielectric mask pattern on the substrate such that the substrate is exposed at a regular interval (d2);
    etching the substrate, which is exposed through the dielectric mask pattern, at a predetermined depth (d3); and
    removing the dielectric mask pattern from the substrate.

3. The method as claimed in claim 2, wherein the interval (d2) is within a range of 0.1 to 15.0 μm.

4. The method as claimed in claim 2, wherein the depth of the substrate to be etched is within a range of 0.1 to 10.0 μm.

5. The method as claimed in claim 2, wherein the substrate is made of a material selected from a group consisting of silicon carbide (SiC), sapphire, gallium arsenide (GaAs) and gallium nitride (GaN).

6. The method as claimed in claim 1, wherein the buffer layer is made of any one of a layer of $Al_xGa_yIn_{1-x-y}N$ ($0 \leq x \leq 1$, $0 \leq y \leq 1$, $0 \leq x+y \leq 1$), a layer of SiN and a laminate film with the layers laminated thereon.

7. The method as claimed in claim 1, wherein after the second step, the first nitride semiconductor thin film has higher defect density on the regions where the stripe-shaped grooves are not formed and lower defect density on the regions where the stripe-shaped grooves are formed.

8. The method as claimed in claim 7, wherein the dielectric mask pattern causes the lower defect density regions of the first nitride semiconductor thin film to be masked and the higher defect density regions of the first nitride semiconductor thin film to be exposed.

9. A method of growing a nitride semiconductor thin film, comprising:
    a first step of forming a buffer layer on an entire top surface of a substrate with grooves formed thereon;
    a second step of growing a first nitride semiconductor thin film on the buffer layer;
    a third step of forming a dielectric mask pattern on the first nitride semiconductor thin film such that the first nitride semiconductor thin film grown on regions of the substrate where the grooves are formed are masked and the first nitride semiconductor thin film grown on regions of the substrate where the grooves are not formed are exposed;
    a fourth step of etching regions of the first nitride semiconductor thin film, which are exposed through the dielectric mask pattern, into a first nitride semiconductor thin film pattern, and removing the dielectric mask pattern from the first nitride semiconductor thin film; and
    a fifth step of laterally growing a second nitride semiconductor thin film using the nitride semiconductor thin film pattern.

10. The method as claimed in claim 9, wherein the grooves are periodically formed.

11. The method as claimed in claim 9, wherein each of the grooves is shaped as a polygon or circle.

12. The method as claimed in claim 9, wherein the buffer layer is formed to have a thickness smaller than a height of an inner wall of the groove.

13. The method as claimed in claim 9, wherein the buffer layer is made of any one of a layer of $Al_xGa_yIn_{1-x-y}N$ ($0 \leq x$ $1$, $0 \leq y \leq 1$, $0 \leq x+y \leq 1$), a layer of SiN and a laminate film with the layers laminated thereon.

14. A method of growing a nitride semiconductor thin film, comprising the following steps in the following order:
    forming grooves on a substrate;
    sequentially forming a buffer layer and a first nitride semiconductor thin film on an entire top surface of the substrate, including the grooves, such that the buffer layer and the first nitride semiconductor thin film are formed on the grooves;
    etching regions of the first nitride semiconductor thin film except regions of the first nitride semiconductor thin film formed on the grooves; and
    forming a second nitride semiconductor thin film.

* * * * *